United States Patent [19]

Anderton

[11] 4,258,975

[45] Mar. 31, 1981

[54] DUAL CABLE AND SUBSTRATE CONNECTOR

[75] Inventor: John J. Anderton, Oil City, Pa.

[73] Assignee: GTE Products Corporation, Stamford, Conn.

[21] Appl. No.: 74,187

[22] Filed: Sep. 10, 1979

[51] Int. Cl.[3] .............................................. H05K 1/12

[52] U.S. Cl. .......................... 339/97 P; 339/176 MP

[58] Field of Search .............. 339/17 L, 17 LM, 17 F, 339/97 R, 97 P, 99 R, 31 R, 32 R, 33, 156 R, 176 MP, 176 MF

[56] References Cited

U.S. PATENT DOCUMENTS

| | | | |
|---|---|---|---|
| 4,023,879 | 5/1977 | Braund et al. | 339/17 F |
| 4,037,906 | 7/1977 | Jayne | 339/17 L |

*Primary Examiner*—Neil Abrams
*Attorney, Agent, or Firm*—Robert E. Walter

[57] ABSTRACT

An electrical connector which is adapted to be terminated to individual conductors of a cable or to conductive portions on opposite faces of a substrate includes a cover member having a front and back section forming a cavity. A plurality of terminals which are arranged along a pair of parallel spaced rows within the cavity have conductor engaging portions facing outwardly for engaging individual conductors and substrate engaging portions facing inwardly for engaging conductive portions on opposite sides of a substrate. The connector may be used to provide cable interconnect or alternately interconnect with a substrate.

16 Claims, 15 Drawing Figures

FIG. 12
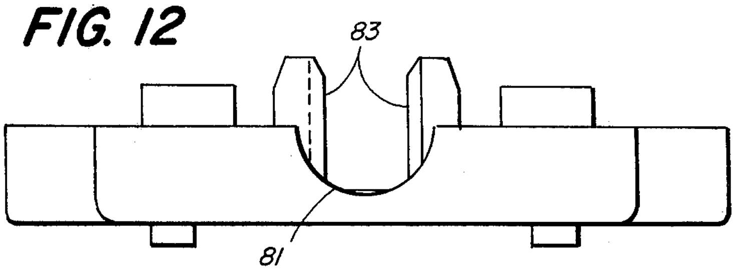
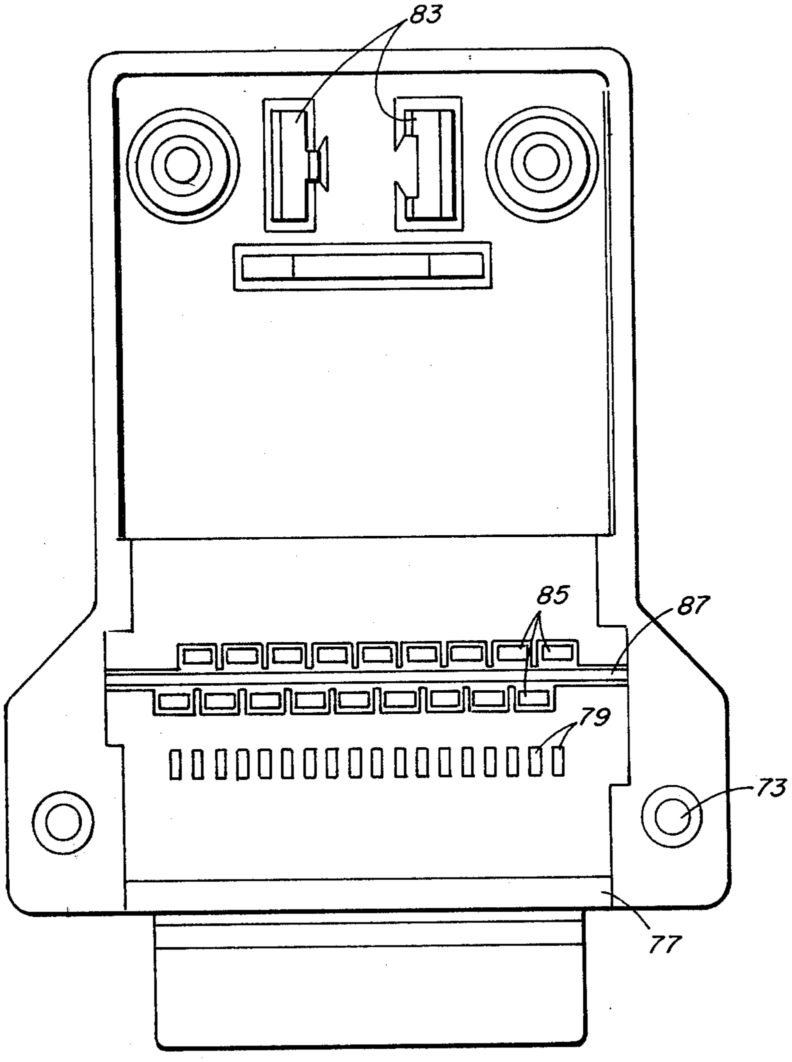
FIG. 11

FIG. 13
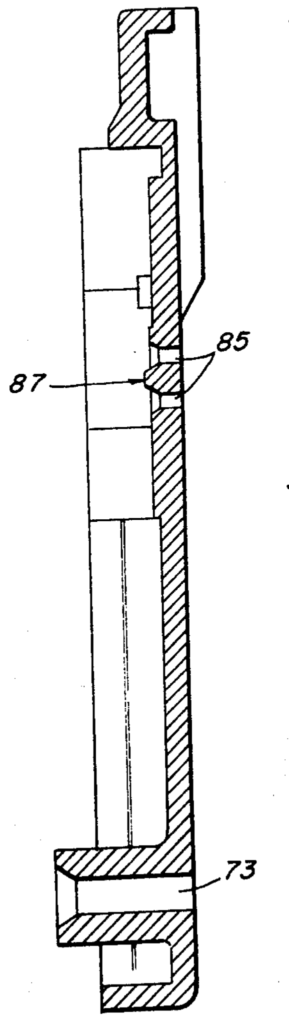
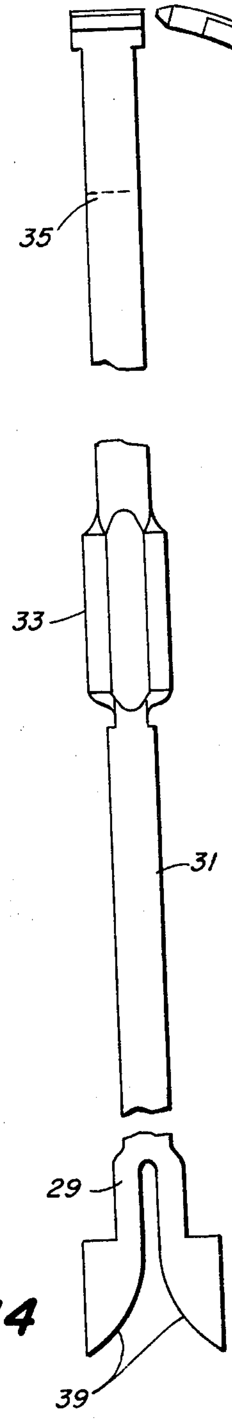
FIG. 14
FIG. 15
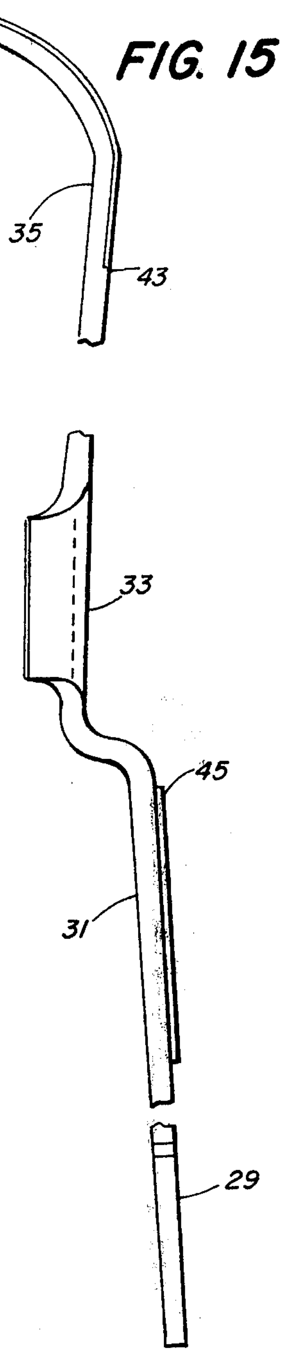

DUAL CABLE AND SUBSTRATE CONNECTOR

TECHNICAL FIELD

The present invention relates to electrical connectors and more particularly to connectors of the type which may be terminated to individual conductors of a cable and to conductive portions on opposite faces of a substrate.

A particular use for the connectors of the nature described is in the telephone switching field. It is often desirable to provide for electrical interconnection between a cable and a printed circuit board. In the other instances it may be desirable to interconnect various circuits or devices on the board or modify electrical signals.

Heretofore, such operations as above described required multiple manual operations and the use of various devices. A connector may be used for interconnecting the cable with the printed circuit board. Jumper cables may be manually connected to various locations on the board such as by soldering to provide electrical interconnection. Similarly, various electrical devices may be connected to the circuits to modify various electrical signals.

It is desirable to have a flexible system wherein a connector may perform a variety of functions or be conveniently adapted for multiple function use.

BACKGROUND ART

U.S. Pat. No. 4,047,785 to Jayne describes a connector assembly having a separate cover means which slidably engages an insulative housing to cover the wire in addition to defining an opening for receiving a wire. The contacts positioned within the housing have a slotted end portion for electrically engaging the wire and an opposing end portion for slidably engaging a male pin.

U.S. Pat. No. 4,037,906 to Jayne relates to a connector having an insulating housing and contacts having a contacting portion within the housing and another portion extending from the housing. A cover is pivotably mounted to the housing for covering a recessed area within the housing.

U.S. Pat. No. 4,106,838 to Jayne relates to a flat cable connector assembly adapted to receive a flat cable having a plurality of aligned conductors and adapted to be plugged into an array or grid of conductor pins. A flat cable is positioned between a top and bottom body so that when the tip and bottom bodies are assembled the contacts pass between adjacent conductors in the cable.

DISCLOSURE OF INVENTION

In accordance with the present invention, there is provided a connector of the type having terminals adapted to be terminated to individual conductors of a cable and to conductive portions on opposite faces of a substrate comprising a cover having a front and back section forming a cavity therebetween for accommodating a substrate, means for positioning a plurality of individual conductors along respective substantially parallel and spaced planes within said cavity, a plurality of terminals, each terminal having a retaining portion, a conductor engaging portion at one end thereof, and a substrate engaging portion intermediate said conductor engaging portion and said retaining portion, said retaining portions being fixedly mounted with respect to said front and back sections whereby said terminals are arranged along a pair of rows with the conductor engaging sections of respective rows facing outwardly and adapted to engage individual conductors and with the substrate engaging portions of respective rows facing inwardly and adapted to engage conductive portions on opposite faces of a substrate.

The connector of the present invention may be used to provide cable interconnect with the terminals or alternately may be used with a substrate or printed circuit board. The printed board may function as a jumper board so as to interconnect various terminals or even be provided with an electrical device to modify electrical signals between terminals.

DESCRIPTION OF THE DRAWINGS

FIG. 11 is a side elevational view of the front section;

FIG. 12 is an end elevational view of the front section as illustrated in FIG. 11;

FIG. 13 is a side elevational view of the front section FIG. 12;

FIG. 14 is a front elevational view of a terminal prior to bending the conductor engaging portion outwardly; and FIG. 15 is a side elevational view of the terminal of FIG. 14.

DETAILED DESCRIPTION OF PREFERRED EMBODIMENTS

Figure 1:
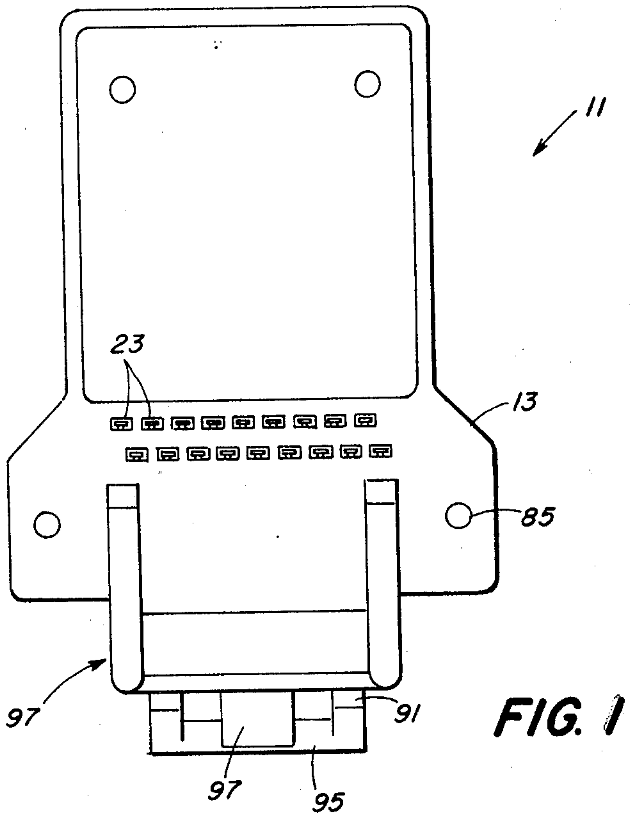
FIG. 1 is a side elevational view of the connector.
Figure 2:
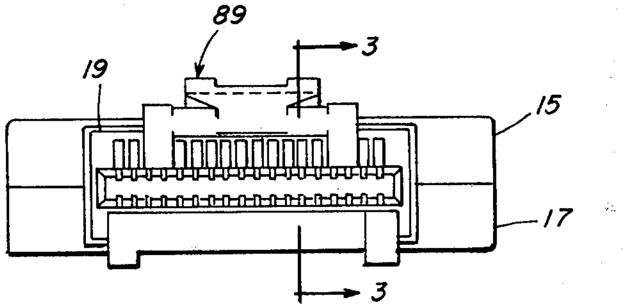
FIG. 2 is an end elevational view.
Figure 3:
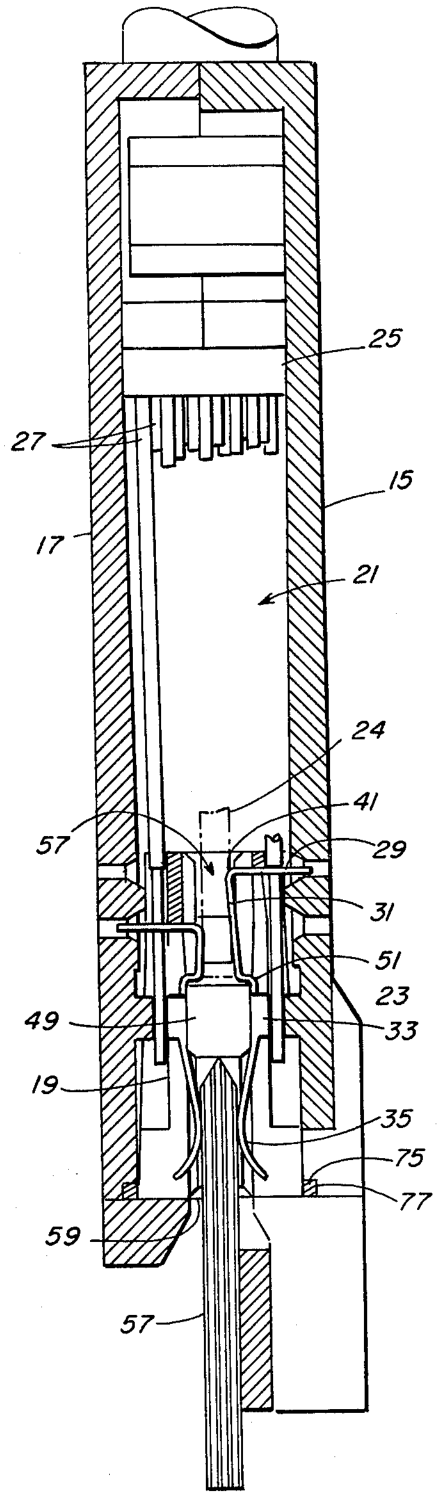
FIG. 3 is a sectional view along section 3—3 of FIG. 2 illustrating additional features.

The connector assembly is generally illustrated in FIG. 1 as reference number 11. A cover 13 includes a front section 15 and rear section 17 with an elongated body 19 held therebetween. FIG. 3, which is a cross sectional view, illustrates a cable 25 having individual conductors 27 connected to respective terminals 23. The individual conductors 27 are positioned within a cavity 21 formed between the front section 15 and rear section 17 above the elongated body 23. Although FIG. 3 illustrates the interconnection of the cable 25, it is contemplated that jumper conductors may be utilized within the cavity 21 to interconnect the various terminals 23. The terminals 23 are so constructed that a small circuit board 24 of the type having conductive portions on marginal edge sections may be utilized in place of conductors to modify electrical signals. The board 24 is represented by phantom lines. When a small board is utilized internal cavity 21, the terminals 23 frictionally engage the board 24 in a wiping manner.

The terminals 23 are illustrated in detail in FIGS. 14 and 15. Each terminal includes a central retaining portion 33 in the form of a compliant section with a conductor engaging portion 29 and a connect portion 35 depending therefrom. The terminals 23 can be made of any suitable material selected for its resilient and electrical conductive property such as copper alloys. Both the connect portion 35 and a substrate engaging portion 31 are bowed away from the retaining portion 33 in the same direction so as to impart resilient biasing properties to these respective sections. To improve electrical contact, a precious metal coating on these respective members is shown at reference number 43 and 45 respectively. The connect portion 35 which is positioned at one end of the terminal 23 is illustrated as a flat tine for engaging conductive portions on a flat substrate so as to permit interconnection of the connector assembly 11 to an external circuit 47 in the form of a substrate with conductive portions thereon.

The conductor engaging portion 29 positioned at the other end of the terminal 23 is in the form of opposing knife edges 39. The knife edges 39 are suited for piercing insulation and engaging the bare wire of conductors 27 for making electrical contact therewith. The conductor engaging portion 29 projects outwardly from the flat substrate engaging portion 31 through a bend 41 in a direction opposite to the bowed direction of the substrate engaging portion 31. The bend 41 is clearly illustrated in FIG. 3.

The elongated body 19 which is interposed the front section 15 and rear section 17 comprises a central section 49 having a plurality of partitions 51 extending outwardly in a direction substantially normal to a central section 49. The partions 51 are disposed between adjacent terminals 23 so as to prevent short circuiting. As illustrated in FIG. 3, both the substrate engaging portions 31 and connect portions 35 of adjacent terminals 23 are separated by respective partions 51. Each of the partitions 51 include an upper slot 53 and a lower slot 55 which serve to form an upper opening 57 and lower opening 59 respectfully. The upper opening 57 communicates with cavity 21 for receipt of a substrate or board 24 and the lower opening 59 communicates with a bottom opening in the connector 11 for connection to the external circuit 47.

Figure 4:
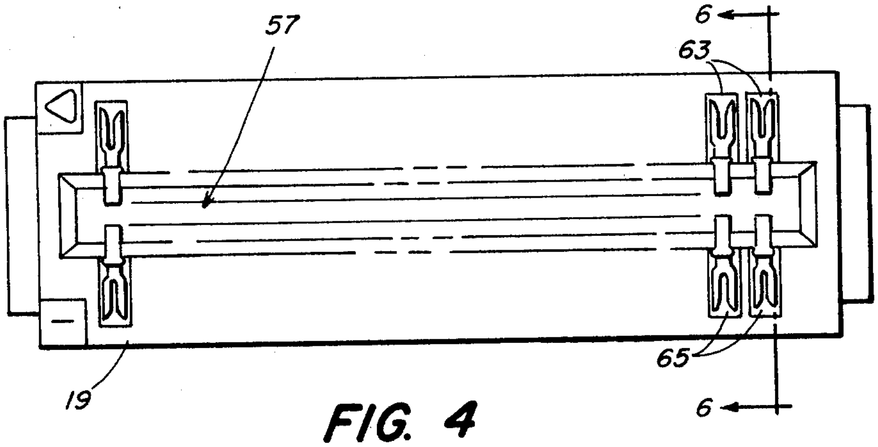
FIG. 4 is a top elevational view of elongated body with terminals.
Figure 8:
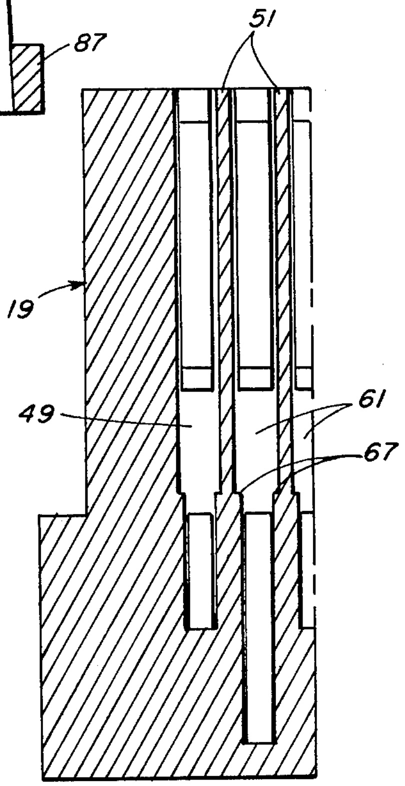
FIG. 8 is a partial sectional view along section 8—8 of FIG. 7.
Figure 7:
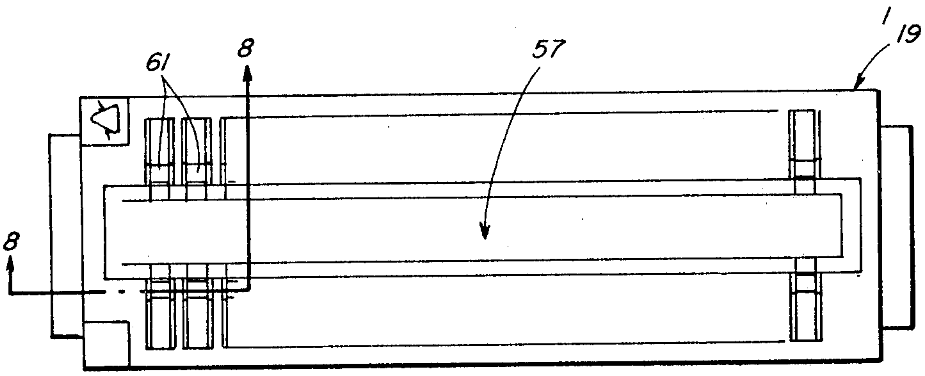
FIG. 7 is a top elevational view of the elongated body without terminals.
Figure 9:
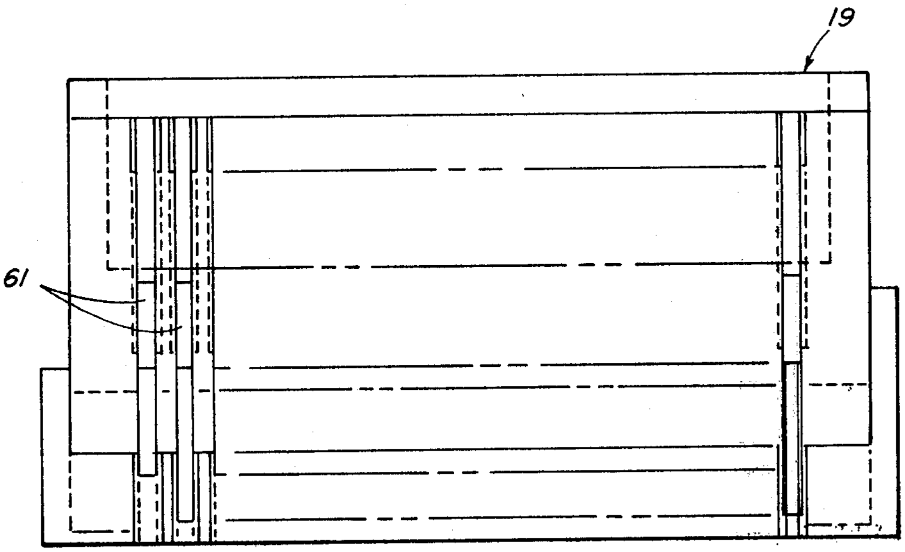
FIG. 9 is a side elevational view of the elongated body of FIG. 7.
Figure 10:
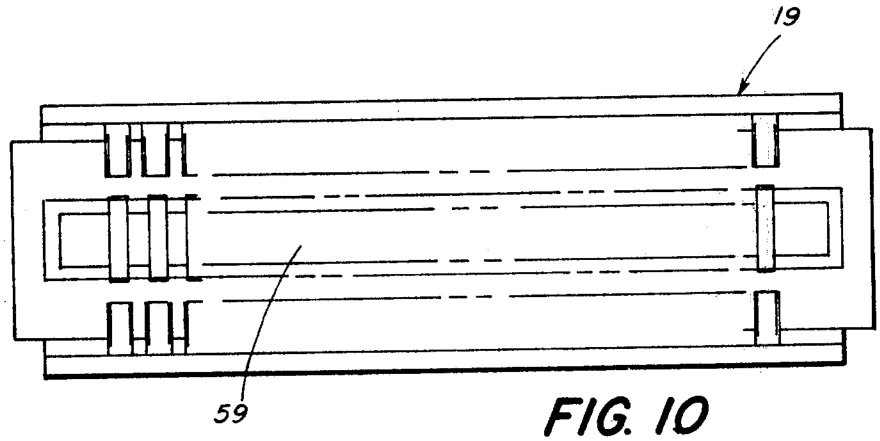
FIG. 10 is a bottom elevational view of the elongated body of FIG. 9.

The elongated body 19 includes a plurality of holes or slots 61 on either side of the central section 49 for securing the retaining portions 33 of respective terminals 23 along a pair of rows 63 and 65 as illustrated in FIG. 4. As illustrated in FIG. 7 and more clearly shown in FIG. 8 which is a sectional view of FIG. 7, the holes 61 are located between respective partitions 51 as a widened section between respective partions as illustrated in FIG. 8. The holes 61 are flanged so that the compliant retaining portions 33 are compressably received between the opposing partitions 51 and expandly seated within respective holes 61. Shoulders 67 act to engage the retaining portions 33 to prevent movement thereof. The retaining portions 33 are fixedly mounted with respect to the front and back sections and arranged along rows 63, 65 with the conductor engaging portions 29 of respective rows facing outwardly and adapted to engage individual conductors 27 and with the substrate engaging portions 31 of respective rows facing inwardly and adapted to engage conductive portions on opposite sides of the substrate 24.

Figure 6:
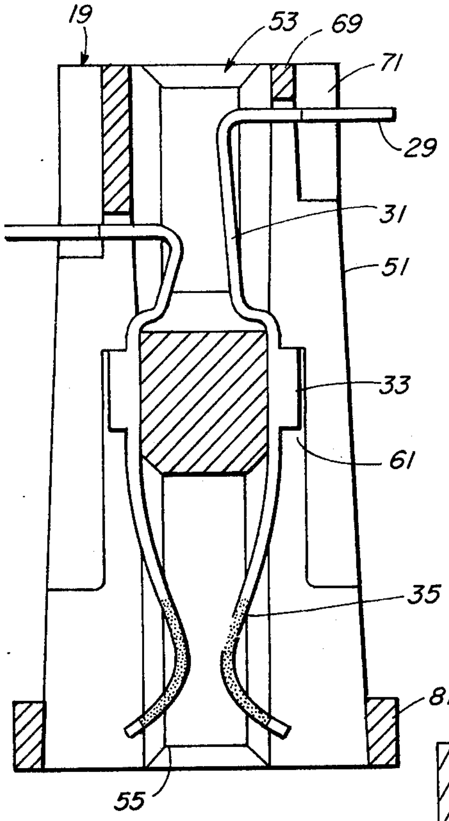
FIG. 6 is a sectional view along section 6—6 of FIG. 4.

The elongated body 19 positions a plurality of individual conductors along respective substantially parallel and spaced planes within the cavity 21 for electrical engagement with respective terminals 23. As illustrated in FIG. 6, the upper portions of the partitions 51 include bridging section 69 therebetween which serve to form respective channels 71 which are aligned with respective conductor engaging portion 33. The opposing knife edges 39 are dimensioned smaller than the dimensions between respective partitions 51 so that the outward movement or deflection of the knife edges 39 is limited as individual conductors 27 are forced into engagement with the conductor retaining portion 29. Intermediate the conductor engaging portion 29 and the retaining section 33, the relatively flat substrate engaging portion 31 projects or extends inwardly into upper opening 57. Due to the resilient nature of the terminals 23, the substrate engaging portion 31 is biased outwardly when a substrate is inserted into upper opening 57 so as to provide frictional engagement with conductive pads on the substrate. Due to the above features, the connector 11 of the present invention may be used for engaging either individual cable conductors 27 or a substrate 24 or both simultaneously.

Figure 5:
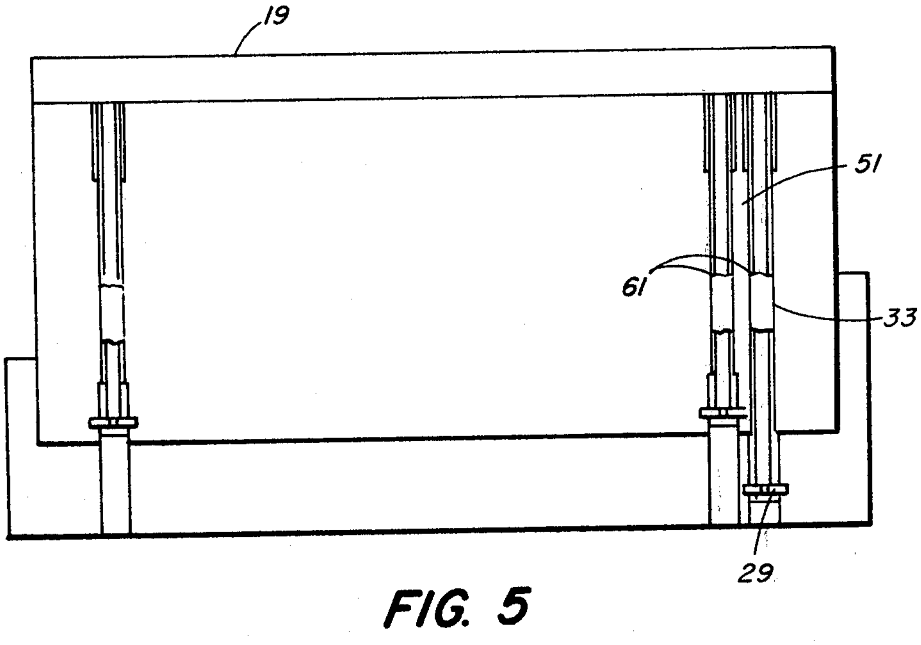
FIG. 5 is a side elevational view of the elongated body of FIG. 4.

As more fully illustrated in FIG. 5, the terminals 23 in each of the respective rows 63, 65 are alternately positioned along a pair of tiers with the conductive engaging portions 29 in each tier being adapted for engaging, in alternating succession, a plurality of individual conductors 27. This feature permits a more compact connector assembly. Due to the staggered array, the inwardly projecting or bowed portions of alternate substrate engaging portions 31 are of different lengths.

The front section 15 as illustrated in FIGS. 11, 12 and 13 is substantially identical to the back section 17 so that the description of the front section 15 also applies to the rear section 17 even though the latter is not illustrated in detail in the drawings. The front section includes a plurality of openings 73 for receipt of fasteners such as a self-tapping screw or nut and bolt. Matching openings on the rear section (not shown) permit assembly of the sections 15, 17 together with the elongated body 19 therebetween. The front member 15 includes a recess 77 which matches a lip 75 in the elongated body 19 for acurately positioning the above parts in assembled relationship. Additional projection 79 which are spaced so as to project between respective partitions 51 also aid in providing accurate alignment and prevent barrier creep which would tend to loosen contacts.

The sections 15 and 17 form a top opening 81 for receipt of a cable therethrough. At least one of the sections 15, 17 includes a pair of jaws 83 for gripping the engaging cable 25. Of course, it is intended when the connector 11 is used in the alternative fashion wherein a substrate 24 is utilized in the cavity 21, jaws 83 which may take up space in the cavity 21 are not necessary.

Each of the sections 15, 17 include a plurality of openings 85 which are in alignment from tier to tier with each of the respective rows 63, 65 for accommodating respective conductor engaging portions 29. Intermediate the aligned rows of openings 85, a ridge 87 projects inwardly toward respective channels 71 of the elongated body 19 which may engage the insulating conductive portions on conductors 27.

The sections 15 and 17 with the elongated body 19 disposed therebetween form a receptacle for the receipt of external circuit or substrate 47 into the lower opening 59. Connect portions 35 depend downwardly inwardly from the retaining portions 33 so as to resiliently engage the substrate 47.

When the connector 11 is used in the mode for providing connection with a cable or individual conductors according to a jumper arrangement, the individual conductors are terminated to the terminals 23 and the front and back sections 15, 17 are assembled. When a cable 25 is utilized, the jaws 83 provide gripping engagement therewith. When the connector 11 is used in conjunction with a substrate, the substrate is inserted into upper opening 57 and the front and rear sections, 15, 17 are fastened together.

INDUSTRIAL APPLICABILITY

The connector has utility for providing connection of a cable or substrate to an external circuit.

I claim:

1. A connector of the type having terminals adapted to be terminated to individual conductors of a cable and to conductive portions on opposite faces of a substrate comprising: a cover having a front and back section forming a cavity therebetween for accommodating a substrate, means positioning a plurality of individual conductors along respective substantially parallel and spaced planes within said cavity, an elongated insulating body held in assembled relationship interposed said front and back sections, a plurality of terminals, each of said terminals having a retaining portion, a conductor engaging portion at one end thereof, and a substrate engaging portion intermediate said conductor engaging portion and said retaining portion, a connect portion at the other end thereof for connecting the terminals to contacts of another connector, said body including a plurality of slots for securing said retaining portions, said body and said retaining portions being fixedly mounted with respect to said front and back sections whereby said terminals are arranged along a pair of rows with the conductor engaging sections of each row facing outwardly and adapted to engage individual conductors and with the substrate engaging portions of each row facing inwardly and adapted to engage conductive portions on opposite faces of a substrate, said body includes an elongated upper opening for receiving conductive portions on opposite sides of a substrate, said substrate engaging sections being bowed inwardly into said opening for engaging said conductive portions on said substrate.

2. A connector according to claim 1 wherein each terminal includes a bend connecting the substrate engaging portion with the conductor engaging portion.

3. A connector according to claim 2 wherein said conductor receiving portions comprises opposing knife edges.

4. A connector according to claim 3 wherein said connect portion depends downwardly and inwardly from said retaining portion and said body includes an elongated lower opening, said connect portions of respective rows projecting into said lower opening from opposite directions.

5. A connector according to claim 4 wherein said body includes a central section and a plurality of partitions attached to said central section for separating said substrate engaging portions, each of said partitions having an upper slot for forming said upper opening.

6. A connector according to claim 5 wherein said partitions are connected by bridging sections on either side of said upper opening.

7. A connector according to claim 4 wherein the terminals in each row are alternately positioned along two tiers with the conductor engaging portions positioned in each tier being adapted for engaging in alternately succession a plurality of conductors.

8. A connector according to claim 7 wherein said bridging sections and said partitions form a plurality of channels for receipt of individual conductors, said conductor engaging portions being associated with respective channels and adapted to make electrical contact with conductors in said channels.

9. A connector according to claim 8 wherein said front and back section each have a plurality of openings in alignment from tier to tier with each row for accommodating respective conductor engaging portions.

10. A connector according to claim 9 wherein said opposing knife edges are dimensioned larger than the dimension between respective partitions for limiting inward movement of said knife edges.

11. A connector according to claim 10 wherein said partions include opposed facing flanges forming respective holes, said retaining portion comprises a compliant section compressably received between opposing flanges and expandably seated within respective holes.

12. A connector according to claim 11 wherein said front and back section each include a plurality of projections for extending between respective partitions for aligning said front and back sections on either side of said body.

13. A connector according to claim 12 including fastening means for holding said front and back sections together with said body therebetween.

14. A connector according to claim 12 wherein said body includes a lip along either side therof, said front and back sections each include a recess for accommodating a respective lip.

15. A connector according to claim 14 wherein said front and back sections form a top opening in said connector for receipt of a cable therethrough.

16. A connector according to claim 15 where at least one said front and back sections includes jaw means for holding said cable.

* * * * *